United States Patent [19]

Kurita et al.

[11] 4,143,328
[45] Mar. 6, 1979

[54] DIGITAL PHASE LOCK LOOP CIRCUIT AND METHOD

[75] Inventors: Shoichi Kurita, Yamato; Yoshitaka Hiratsuka, Yokohama; Kazuya Shuto, Kawasaki, all of Japan

[73] Assignee: Fujitsu Limited, Japan

[21] Appl. No.: 849,706

[22] Filed: Nov. 8, 1977

[30] Foreign Application Priority Data

Nov. 10, 1976 [JP] Japan ................................ 51-135026

[51] Int. Cl.² ............................................ H03K 1/17
[52] U.S. Cl. ..................................... 328/155; 328/63;
331/25; 331/1 A
[58] Field of Search ................. 328/155, 133, 134, 63;
331/25, 1 A

[56] References Cited

U.S. PATENT DOCUMENTS

| | | | |
|---|---|---|---|
| 3,781,695 | 12/1973 | Jackson | 328/155 |
| 3,870,970 | 3/1975 | Chibana | 328/155 X |
| 3,872,397 | 3/1975 | Hanneman | 331/25 X |
| 3,988,696 | 10/1976 | Sharpe | 331/1 A |
| 4,001,713 | 1/1977 | Egan | 331/1 A |

Primary Examiner—John S. Heyman
Attorney, Agent, or Firm—Staas & Halsey

[57] ABSTRACT

A digital phase lock loop circuit and method wherein the phase and the frequency of an output clock pulse of the circuit are made to instantaneously coincide with the phase and the frequency of an input clock pulse of the circuit. The digital phase lock loop circuit includes a fixed frequency generator circuit, an output frequency divider to which a standard clock pulse from the fixed frequency generator circuit is supplied via an inhibit gate, an output clock pulse frequency divider which divides the frequency of the output clock pulse from the output frequency divider, a phase comparator to which the input clock pulse and the divided clock pulse from the output clock pulse frequency divider are provided and an inhibit pulse generator to which the output of the phase comparator is supplied, so as to provide an inhibit pulse from the inhibit pulse generator to the inhibit gate. Further, according to the present invention, a clear pulse generator is provided for the purpose of forming a clear pulse which clears the contents of the output frequency divider and the output clock frequency divider. Such clear pulse is generated based on the condition that the time difference between a first occurrence (the frequency division of the output frequency divider being actuated by the standard clock pulse after the output frequency divider, and the output clock frequency divider being cleared by the clear pulse) and a second occurrence (the frequency division of the input frequency divider being actuated by the input clock pulse) is smaller than a predetermined period of the standard clock pulse.

31 Claims, 9 Drawing Figures

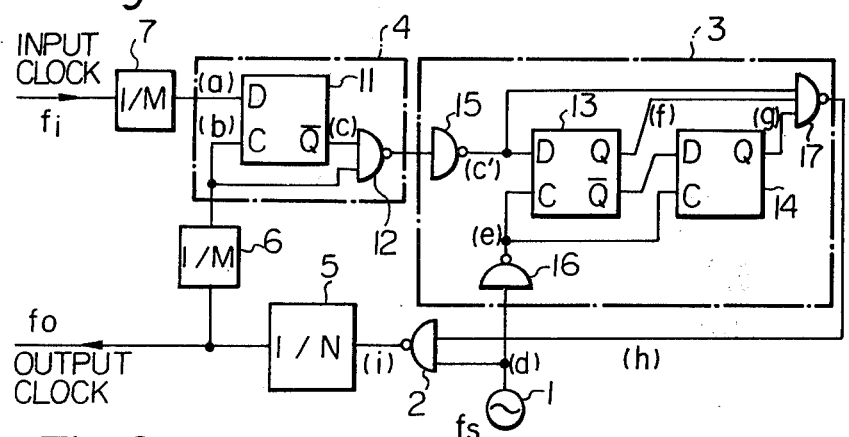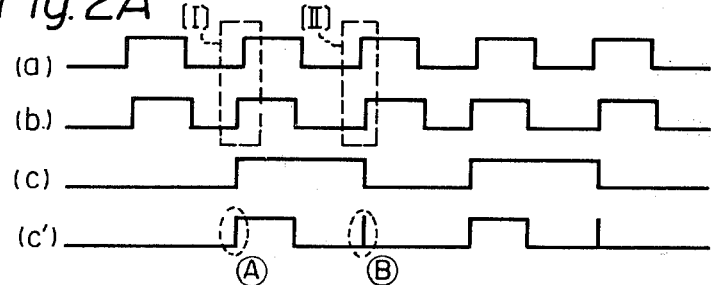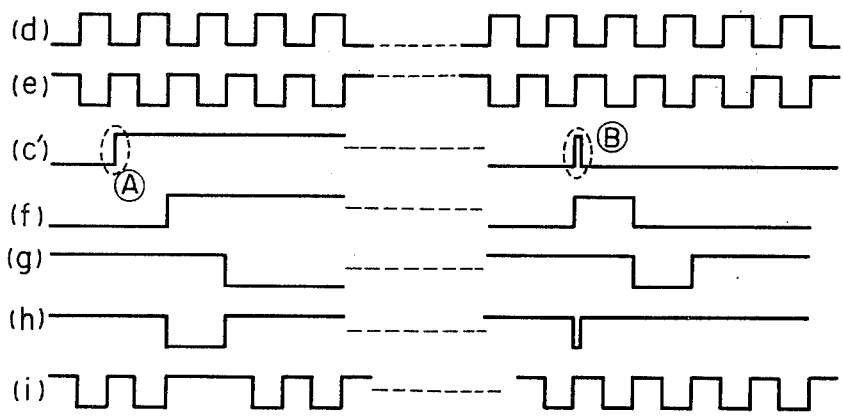

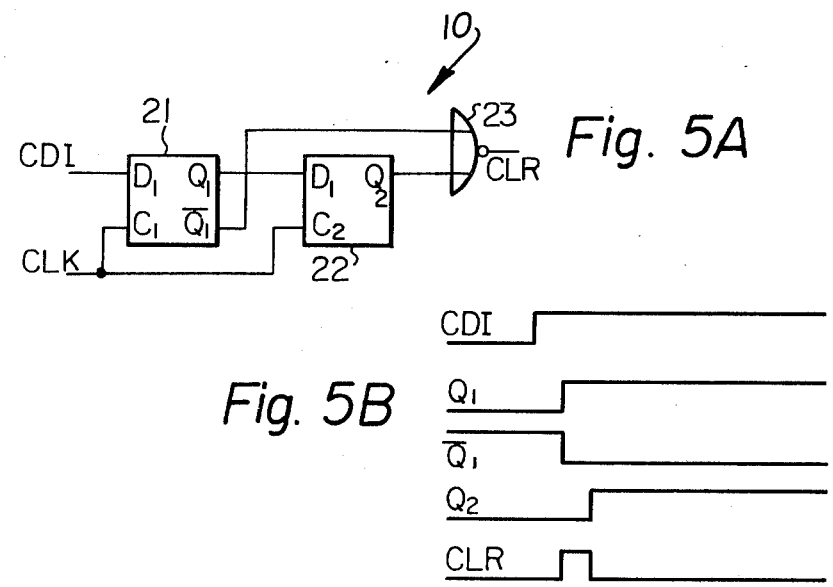
Fig. 5A
Fig. 5B
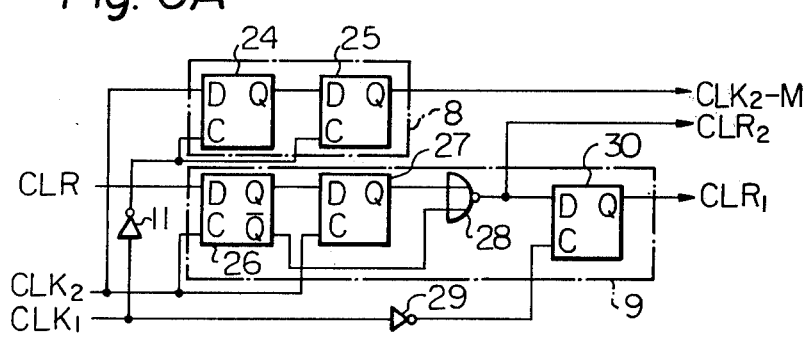
Fig. 6A
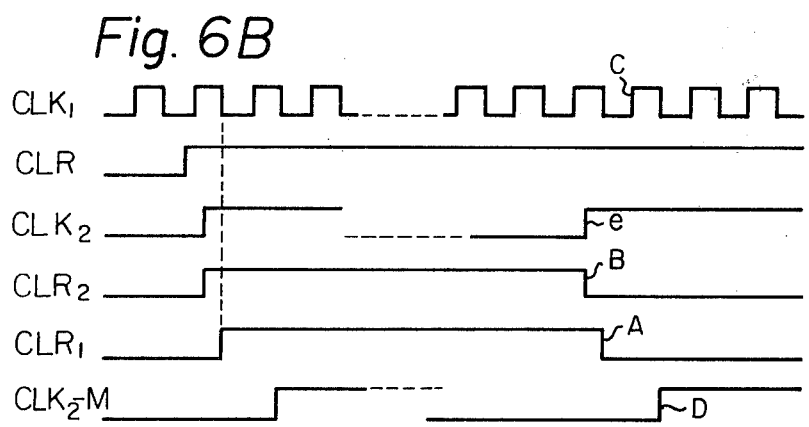
Fig. 6B

DIGITAL PHASE LOCK LOOP CIRCUIT AND METHOD

DETAILED EXPLANATION OF THE INVENTION

The present invention relates to a digital phase lock loop circuit and method, wherein an output clock pulse can be caused to follow instantaneously the input clock pulse of the circuit.

The phase lock loop circuit and method are widely used in a transmission apparatus for the purposes of extracting the timing of a detector, of synchronizing the phase of various circuits, or of smoothing the phase of the various circuits. A conventional phase lock loop circuit is formed by using a voltage-controlled oscillator. A phase lock loop circuit which is formed by a phase synchronization control system including a fixed frequency generator and a digital circuit has been recently proposed. According to this proposed circuit, adjustment thereof is facilitated or no adjustment of the circuit is required. The circuit can be manufactured by using a large scale integration technique. However, in the phase lock loop circuit which includes the fixed frequency generator, the output clock pulse of the circuit should, in a stable manner, follow the input pulse of the circuit, and the jitter phenomenon occurring in the output signal should be sufficiently suppressed. For example, a MODEM system includes one operational mode which synchronizes the system with an internal clock pulse and another operational mode which synchronizes the system with an external clock pulse. Therefore, the digital phase lock loop circuit is provided in the MODEM system, the circuit being frequently required to change the first operational mode to the second operational mode in the MODEM system. If the phase of the input clock pulse is not coincident with the output clock pulse of the circuit when the operational mode is changed, the initial data is misread. Misreading creates serious damage in the usual data transmission system. For example, in the conventional phase lock loop circuit, if the comparison frequency is 800 Hz, and the fixed frequency is 1152.3 KHz (the input signal frequency $f_i$ is 1,600 Hz, the ratio M of the input clock pulse frequency to the comparison frequency is 2, and the fixed frequency $f_s$ is 1152.3 KHz), then the phase difference is 180° when the symbol rate is 1600 baud, and data corresponding to about 720 symbols is lost. This type of disadvantage should not occur in the data transmission and is to be avoided.

An object of the present invention is to provide, while taking the above-mentioned drawback into consideration, a digital phase lock loop circuit and method, wherein the phase and the frequency of the output clock pulse of the circuit instantaneously coinciding with those of the input clock pulse of the circuit.

For achieving the above-mentioned object, the digital phase lock loop circuit includes a fixed frequency generator circuit, an output frequency divider to which a standard clock pulse from the fixed frequency generator circuit is supplied via an inhibit gate, an output clock pulse frequency divider which divides the frequency of the output clock pulse from the output frequency divider, a phase comparator to which the input clock pulse and the divided clock pulse from the output clock pulse frequency divider are supplied, and an inhibit pulse generator to which the output of the phase comparator is supplied, so as to provide an inhibit pulse from the inhibit pulse generator to the inhibit gate. According to a further characteristic feature of the present invention, a clear pulse generator is provided for the purpose of forming a clear pulse which clears the contents of the output frequency divider and the output clock frequency divider. Such clear pulse is generated based on the condition that the time difference between a first occurrence (the frequency division of the output frequency divider being actuated by the standard clock pulse after clearing of the output frequency divider and the output clock frequency divider by the clear pulse) and a second occurrence (the frequency division of the input frequency divider being actuated by the input clock pulse) is smaller than a predetermined period of the standard clock pulse.

The foregoing and other objects, features and attendant advantages of the invention will be better understood from the following description with reference to the accompanying drawings wherein:

FIG. 1 is a block diagram showing one example of a conventional digital phase lock loop circuit;

FIGS. 2A and 2B are waveforms produced by the circuit shown in the block diagram of FIG. 1;

Figure 4:
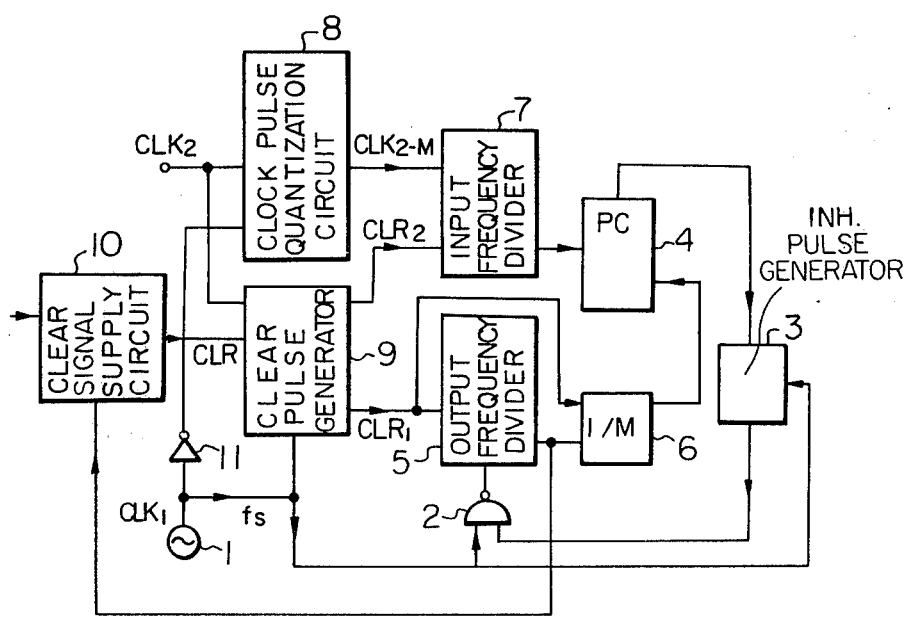
FIG. 4 is a block diagram of one embodiment of the digital phase lock loop circuit according to the present invention.

FIG. 5A is a block diagram of one example of the clear signal supply circuit 10 in the block diagram shown in FIG. 4, and FIG. 5B shows waveforms produced by the circuit of FIG. 5A; and FIG. 6A is a block diagram of one example of the clock pulse quantization circuit 8 and the clear pulse generator 9 in the block diagram shown in FIG. 4, and FIG. 6B shows waveforms produced in the circuit of FIG. 6A.

As shown in FIG. 1, the conventional digital phase lock loop circuit provides a fixed frequency generator 1, an output frequency divider 5 to which a standard clock pulse $f_s$ is supplied via an input of an inhibit gate 2 from the fixed frequency generator 1, an input frequency divider 7, an output clock pulse frequency divider 6 which divides the frequency of the output of the output frequency divider 5, a phase comparator 4 which compares the phases of the frequency divided input clock pulse and the divided output clock pulse of the output clock pulse frequency divider 6, and an inhibit pulse generator 3 to which the output of the phase comparator is applied. The output of the inhibit pulse generator 3 is connected to another input of the inhibit gate 2. The phase comparator circuit 4 includes a D-type flip-flop circuit 11 and an inhibit gate 12, and the inhibit pulse generator 3 includes D-type flip-flop circuits 13 and 14, and inhibit gates 15, 16 and 17.

Next, we will explain the functions of the conventional digital phase lock loop circuit shown in FIG. 1 by referring to FIGS. 2A and 2B. The phase comparator 4 compares the frequency divided input clock pulse (a) and the frequency divided output clock pulse (b) both shown in FIG. 2A. In FIG. 2A, a portion [1] shows the case wherein the phase of the frequency divided input clock pulse (a) is lagging with respect to the phase of the frequency divided output clock pulse (b), and the output (c') of the inhibit gate 15 is changed from a logic value "0" to a logic value "1" at a point A shown in FIG. 2A. The time axis of this portion has been enlarged and is shown in the left part of FIG. 2B. When the frequency divided input clock pulse (a) is lagging with respect to the frequency divided output clock pulse (b), an inhibit pulse as shown in the left part of (h) of FIG. 2B is obtained. By this inhibit pulse, one bit of clock pulse (d) from the fixed frequency generator 1 is eliminated and a series of pulses shown in (i) of FIG. 2B is sent out from the inhibit gate 2.

A portion [II] of FIG. 2A shows the case wherein the frequency divided input clock pulse (a) is advanced with respect to the frequency divided output clock pulse (b). The time axis of this portion is enlarged and shown in the right side of FIG. 2B. When the frequency divided input clock pulse (a) is advanced with respect to the frequency divided output clock pulse (b), a positive fine pulse B appears at the output (c') of the inhibit gate 15 as shown in FIG. 2B. This occurs due to the delay of the D-type flip-flop circuit 11 of the phase comparator 4. If this fine pulse is not read by the D-type flip-flop circuit 13 of the inhibit pulse generator 3, the output of the inhibit gate 17 remains at a logical value "1" and the clock pulse (d) in FIG. 2B from the fixed frequency generator 1 is not eliminated. If this positive fine pulse is read by the D-type flip-flop circuit, thirteen pulses are generated in the set output (f) of the D-type flip-flop circuit 13 and the set output (g) of the D-type flip-flop circuit 14. In addition, an inhibit pulse which eliminates one bit from the clock pulse is generated. For overcoming this phenomenon, wherein the fine pulse is read by the D-type flip-flop circuit 13, the output (c') of the inhibit gate 15 is applied to the inhibit gate 17, for generating only a negative pulse at the output (h) of the inhibit gate 17. Consequently the clock pulse (d) of the fixed frequency generator 1 is not eliminated therefrom.

Figure 3:
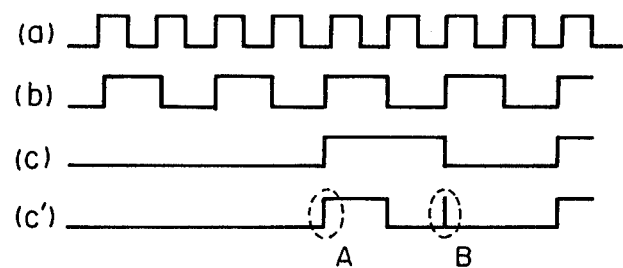
FIG. 3 shows waveforms produced by another conventional digital phase lock loop circuit not shown in the drawing.

In the circuit shown in FIG. 1, the input frequency divider circuit 7 is not necessarily required. The output clock pulse can be synchronized with the input clock pulse by comparing the phase of the input clock pulse with that of the frequency divided output clock pulse. FIG. 3 shows waveforms produced in a digital phase lock loop circuit which does not contain an input frequency divider circuit. In this case a clock pulse (a) having a frequency $f_i$ is directly applied to the set input terminal of the D-type flip-flop circuit 11 as the input clock pulse. When this clock pulse (a) is read by the frequency divided clock pulse (b), the output (c) is obtained. When the pulse (b) is logically multiplied with the output signal (c), the signal (c') in FIG. 3 is obtained. As the following function is the same as that of FIG. 1, we will therefore not provide a detailed explanation for the function of FIG. 3.

In the conventional digital phase lock loop circuit as shown in FIG. 1, when the phase difference between two phases to be compared is 180°, a time period of $N^2M/2f_s$ seconds is required for causing the output clock pulse to coincide with the input clock pulse, wherein N is a frequency division ratio in the output frequency divider 5, M is a ratio between the input clock pulse frequency and the clock pulse frequency to be compared in the frequency comparator circuit 4, and $f_s$ is a frequency of the fixed frequency generator.

FIG. 4 is one embodiment of the digital phase lock loop circuit according to the present invention. As shown in FIG. 4, according to the present invention, a clock pulse quantization circuit 8, a clear pulse generator 9 and a clear signal supply circuit 10 are added to the conventional circuit shown in FIG. 1.

The clear signal supply circuit 10 is composed of, as shown in FIG. 5A, D-type flip-flop circuits 21, 22 and a NOR circuit 23. The clear signal supply circuit 10 receives the input signal CDI and forms a clear signal CLR. FIG. 5B shows the waveforms in each part of the clear signal supply circuit 10.

The clock pulse quantization circuit 8 is composed of, as shown in FIG. 6A, D-type flip-flop circuits 24 and 25, and the clear pulse generator 9 is composed of D-type flip-flop circuits 26 and 27, a NOR circuit 28, an inverter circuit 29 and a D-type flip-flop circuit 30.

If no input signal CDI is applied to the clear signal supply circuit 10, that is, when the MODEM system is actuated by the internal clock pulses produced in the MODEM system, no clear signal CLR is sent out from the clear signal supply circuit 10. When an input signal is applied to the clear signal supply circuit 10, that is, when the operation mode is changed to the mode which synchronizes the MODEM system with the external clock pulses, the clear signal supply circuit 10 sends out a clear signal CLR. The clear signal CLR is applied to a D-input of the D-type flip-flop circuit 26.

With reference to FIGS. 6A and 6B, when the clear signal CLR has a logical value "1" and when the input clock pulse $CLK_2$ is increased from a logical value "0" to a logical value "1," the Q-output of the D-type flip-flop circuit 26 becomes a logical value "0," and this value "0" is inverted in the NOR circuit 28 and the output of the NOR circuit 28 ($CLR_2$) becomes a logical value "1." When the value of the next input clock pulse $CLK_2$ is applied, the Q-output of the D-type flip-flop circuit 26 becomes a logical value "1," thus causing the output of the NOR circuit 28 ($CLR_2$) to become a logical value "0." Therefore, the second clear pulse $CLR_2$ corresponds to the pulse which is formed as a result of the differentiation process of the clear signal CLR by the input clock pulse $CLK_2$.

The second clear pulse $CLR_2$ is applied to a D-input of the D-type flip-flop circuit 30, and the standard clock pulses $CLK_1$ are inverted by an inverter 29 and applied to the C-input of the D-type flip-flop circuit 30. As a result, the clear pulse $CLR_1$, as shown in FIG. 6B, is obtained at the output of the D-type flip-flop circuit 30.

The content of the input frequency divider 7 is cleared by a leading edge of the second clear pulse $CLR_2$, and the clear is released by a trailing edge of the second clear pulse $CLR_2$. The frequency division in the input frequency divider 7 is actuated by the leading edge D of the quantized input clock pulse $CLK_2$-M as shown in FIG. 6B. The contents of the output frequency divider 5 and the output clock pulse divider 6 are cleared by the leading edge of the first clear pulse $CLR_1$, and the clear of the output clock pulse divider 6 is released by the trailing edge A of the first clear pulse $CLR_1$. The frequency divisions in these dividers 5 and 6 are actuated by the leading edge of the standard clock pulses $CLK_1$.

The clock pulse quantization circuit 8 is provided for the following reason. If this clock pulse quantization circuit 8 is not provided, the trailing edge B of the second clear pulse $CLR_2$ will coincide with the leading edge e of the input clock pulse $CLK_2$ or will occur somewhat later than the leading edge e of the input clock pulse $CLK_2$. Under these conditions, when the frequency division of the input frequency divider 7 is not actuated by the leading edge e of the input clock pulse $CLK_2$, as may sometime occur, it can still be actuated by the leading edge of the next input clock pulse CLK$_2$. When the frequency division of the output frequency divider 5 is actuated by the leading edge C of the standard clock pulse CLK$_1$ and the frequency division of the input frequency divider 7 is actuated by the leading edge of the input clock pulse which is one pulse later than the leading edge e of the input clock pulse CLK$_2$, the output clock pulses of the digital phase lock loop circuit can instantaneously follow the input clock pulse of the circuit. For the purpose of causing the output clock pulse to instantaneously follow the input clock pulse, the leading edge of the clock pulse CLK$_2$-M supplied to the input frequency divider 7 should be later than the point B when the clear is released. Accordingly, the clock pulse quantization circuit 8 is provided in the circuit shown in FIG. 4 causing the leading edge D of the clock pulse CLK$_2$-M to arrive one bit later than point B where the clear CLR$_2$ is removed. On the other hand, by the clear pulse generator 9, the leading edge C of the standard clock pulse CLK$_1$ and point A where the first clear pulse CLR$_1$ is released are positioned apart at a distance corresponding to one half of the standard clock pulse (CLK$_1$) period. Therefore, the distance between point C where the frequency division of the output frequency divider 5 is actuated and the point D where the frequency division of the output clock pulse generator 6 is actuated equals one-half of the standard pulse period, and the frequency division in the frequency dividers 5, 6, and 7 are actuated almost simultaneously after these dividers are cleared. As a result, the output clock pulse of the digital phase lock loop circuit according to the present invention can instantaneously follow the input clock pulse of the circuit.

The above-mentioned digital phase lock loop circuit has an input frequency divider 7. However, it is understood that the input frequency divider 7 can be extracted. When the digital phase lock loop has no input frequency divider 7, only the clear pulse generator 9 is used. In this case it is not necessary to use the clock pulse quantization circuit 8. Accordingly, the second clear pulse and the quantized input clock pulse CLK$_2$-M are not required.

As shown in the above-explanation, according to the present invention, the output clock pulse can be caused to instantaneously follow the input clock pulse by only the addition of some simple circuits to the conventional digital phase lock loop circuit. Furthermore, the present invention is very effective when the digital phase lock loop circuit is constructed by the using large-scale integration technique, because the delay of the propagation time of the elements in the integrated circuit is not constant in every element and a sufficient time margin is required between the time when the clear pulse is cleared and when the leading edge of the clock pulse occurs.

What is claimed is:

1. A digital phase lock loop circuit for phase-locking an input clock signal to an output clock signal, comprising:

a fixed frequency oscillator for generating a fixed-frequency standard clock signal, inhibit means responsive to a received inhibit pulse for selectively passing said standard clock signal, output frequency divider means for frequency-dividing said standard clock pulse from said fixed frequency oscillator to produce an output clock pulse, output clock pulse divider means for frequency-dividing the output clock pulse of said output frequency divider means, phase comparator means for receiving said input clock pulse and said frequency-divided output clock pulse so as to generate a phase comparison output, inhibit pulse generator means for receiving the phase comparison output of said phase comparator means, and responsive thereto for generating said inhibit pulse received by said inhibit means, said digital phase lock loop circuit further comprising clear pulse generator means for generating a clear pulse, said output frequency divider means and said output clock pulse divider means being responsive thereto for clearing the respective contents thereof, thereby causing said output clock pulse to instantaneously follow said input clock pulse.

2. A digital phase lock loop circuit according to claim 1, wherein said pulse generator means generates said clear pulse with such timing that said output frequency divider means and said output clock pulse divider means are both cleared in advance of that time when the frequency division of said output frequency divider means is actuated by one-half of the period of said standard clock pulse.

3. A digital phase lock loop circuit according to claim 1, further comprising an input frequency divider means for frequency-dividing the input clock pulse prior to input to said phase comparator means, and clock pulse quantization means for quantizing said input clock pulse prior to input to said input frequency divider means, so that said clear pulse generator means forms said clear pulse with such timing that the time difference between a first occurrence, at which the frequency division of said output frequency divider means is actuated by said standard clock pulse after said output frequency divider means and said output clock pulse divider means are cleared by said clear pulse, and a second occurrence, at which the frequency division of said input frequency divider means is actuated by said quantized input clock pulse, is smaller than a predetermined period of said standard clock pulse.

4. A digital phase lock loop circuit according to claim 1, said circuit comprising means for supplying a clear signal to said clear pulse generator means, and means for supplying said input clock signal to said clear pulse generator means, wherein said clear pulse generator means comprises a differentiation circuit which differentiates said clear signal supplied thereto in accordance with said input clock pulse to produce a differentiation output, and a D-type flip-flop circuit having a D input for receiving the differentiation output and a C input for receiving an inverted version of said standard clock signal, and responsive thereto for generating said clear pulse.

5. A digital phase lock loop circuit according to claim 1, further comprising clock pulse quantization means for receiving said input clock pulse, and responsive thereto for quantizing said input clock pulse prior to input to said phase comparator means.

6. A digital phase lock loop circuit according to claim 3, wherein said clear pulse generator means generates an additional clear pulse, said input frequency divider means being responsive thereto for clearing the contents thereof.

7. A digital phase lock loop circuit according to claim 6, wherein said clear pulse generator generates said clear pulse with such timing that the clearing of said output frequency divider means and said output clock pulse divider means is advanced one-half period of said standard clock pulse with respect to the commencement of frequency division by said output frequency divider means.

8. A digital phase lock loop circuit according to claim 6, wherein said clear pulse generator means generates said clear pulse and said additional clear pulse with such timing that the time difference between the time of clearing of said output frequency divider means and said output clock pulse divider means, and the time of clearing of said input frequency divider means, is smaller than one-half the period of said standard clock pulse.

9. A digital phase lock loop circuit according to claim 3, wherein said clock pulse quantization means forms said quantized input clock pulse with such timing that the release of the clearing of said input frequency divider means lags the actuation of the frequency division of said input frequency divider means by a time lag equal to between one period and one-and-one-half periods of said standard clock pulse.

10. A digital phase lock loop circuit according to claim 3, wherein said clock pulse quantization means comprises a plurality of D-type flip-flop circuits which are connected in cascade, and wherein said D-type flip-flop circuits have a D-type input terminal and a C-type input terminal, said input clock pulse being applied to said D-input terminal of a first one of said cascaded D-type flip-flop circuits, and an inverted version of said standard clock pulse being applied to said C-input terminal of a first one of said cascaded D-type flip-flop circuits.

11. A digital phase lock loop circuit according to claim 6, said circuit comprising means for supplying a clear signal to said clear pulse generator means, and means for supplying said input clock signal to said clear pulse generator means, wherein said clear pulse generator means comprises a differentiation circuit which differentiates said clear signal applied in accordance with said input clock pulse to produce a differentiation output forming said second clear pulse, and a D-type flip-flop circuit having a D-input terminal for receiving said second clear pulse, and a C-input terminal for receiving an inverted version of said standard clock signal, and responsive thereto for generating said first clear pulse.

12. In a digital phase lock loop circuit for processing an input clock signal to provide an output clock signal, said circuit including:
  oscillator means for generating a fixed-frequency standard clock signal,
  inhibit means responsive to a received inhibit pulse for selectively passing said standard clock signal,
  output frequency divider means for frequency-dividing said standard clock signal selectively passed by said inhibit means to produce said output clock signal,
  output clock pulse divider means for frequency-dividing said output clock signal to provide a frequency-divided output clock signal, and
  inhibit pulse generating means for receiving said input clock signal and said frequency-divided output clock signal, and responsive thereto for generating said inhibit pulse received by said inhibit means;

the improvement comprising clear pulse generator means for generating a clear pulse, said output frequency divider means and said output clock pulse divider means being responsive thereto for clearing the respective contents thereof, whereby to cause said output clock signal to instantaneously follow said input clock signal.

13. In the digital phase lock loop circuit of claim 12, wherein said pulse generator means generates said clear pulse with such timing that said output frequency divider means and said output clock pulse divider means are both cleared in advance, by one-half of the period of said standard clock pulse, of that time when the frequency division of said output frequency divider means is actuated.

14. In the digital phase lock loop circuit of claim 12, further comprising input frequency divider means for frequency-dividing the input clock pulse prior to input to said inhibit pulse generating means, and clock pulse quantization means for quantizing said input clock pulse prior to input to said input frequency divider means, so that said clear pulse generator means forms said clear pulse with such timing that the time difference between a first occurrence, at which the frequency division of said output frequency divider means is actuated by said standard clock pulse after said output frequency divider means and said output clock pulse divider means are cleared by said clear pulse, and a second occurrence, at which the frequency division of said input frequency divider means is actuated by said quantized input clock pulse, is smaller than a predetermined period of said standard clock pulse.

15. In the digital phase lock loop circuit of claim 14, wherein said clear pulse generator means generates an additional clear pulse, said input frequency divider means being responsive thereto for clearing the contents thereof.

16. In the digital phase lock loop circuit of claim 15, wherein said clear pulse generator generates said clear pulse with such timing that the clearing of said output frequency divider means and said output clock pulse divider means is advanced one-half period of said standard clock pulse with respect to the commencement of frequency division by said output frequency divider means.

17. In the digital phase lock loop circuit of claim 15, wherein said clear pulse generator means generates said clear pulse and said additional clear pulse with such timing that the time difference between the time of clearing of said output frequency divider means and said output clock pulse divider means, and the time of clearing of said input frequency divider means, is smaller than one-half the period of said standard clock pulse.

18. In the digital phase lock loop circuit of claim 15, said circuit comprising means for supplying a clear signal to said clear pulse generator means, and means for supplying said input clock signal to said clear pulse generator means, wherein said clear pulse generator means comprises a differentiation circuit which differentiates said clear signal applied in accordance with said input clock pulse to produce a differentiation output forming said second clear pulse, and a D-type flip-flop circuit having a D-input terminal for receiving said second clear pulse, and a C-input terminal for receiving an inverted version of said standard clock signal, and responsive thereto for generating said first clear pulse.

19. In the digital phase lock loop circuit of claim 14, wherein said clock pulse quantization means forms said quantized input clock pulse with such timing that the release of the clearing of said input frequency divider means lags the actuation of the frequency division of said input frequency divider means by a time lag equal to between one period and one-and-one-half periods of said standard clock pulse.

20. In the digital phase lock loop circuit of claim 14, wherein said clock pulse quantization means comprises a plurality of D-type flip-flop circuits which are connected in cascade, and wherein said D-type flip-flop circuits have a D-type input terminal and a C-type input terminal, said input clock pulse being applied to said D-input terminal of a first one of said cascaded D-type flip-flop circuits, and an inverted version of said standard clock pulse being applied to said C-input terminal of a first one of said cascaded D-type flip-flop circuits.

21. In the digital phase lock loop circuit of claim 12, said circuit comprising means for supplying a clear signal to said clear pulse generator means, and means for supplying said input clock signal to said clear pulse generator means, wherein said clear pulse generator means comprises a differentiation circuit which differentiates said clear signal supplied thereto in accordance with said input clock pulse to produce a differentiation output, and a D-type flip-flop circuit having a D input for receiving the differentiation output and a C input for receiving an inverted version of said standard clock signal, and responsive thereto for generating said clear pulse.

22. In the digital phase lock loop circuit of claim 12, further comprising clock pulse quantization means for receiving said input clock pulse, and responsive thereto for quantizing said input clock pulse prior to input to said inhibit pulse generating means.

23. In a digital phase lock loop circuit for processing an input clock signal to provide an output clock signal, said circuit including:
   oscillator means for generating a fixed-frequency standard clock signal,
   inhibit means responsive to a received inhibit pulse for selectively passing said standard clock signal,
   frequency divider means responsive to said standard clock signal selectively passed by said inhibit means to provide a frequency-divided output clock signal, and
   inhibit pulse generating means for receiving said input clock signal and said frequency-divided output clock signal, and responsive thereto for generating said inhibit pulse received by said inhibit means;
   the improvement comprising input frequency divider means for frequency-dividing the input clock pulse prior to input to said inhibit pulse generating means, and clear pulse generator means for generating a clear pulse to clear the contents of said input frequency divider means.

24. In the digital phase lock loop circuit of claim 23, wherein said clear pulse generator means generates an additional clear pulse to clear the contents of said frequency divider means, said circuit further comprising clock pulse quantization means for quantizing said input clock pulse prior to input to said input frequency divider means, so that said clear pulse generator means forms said clear pulse with such timing that the time difference between a first occurrence, at which the frequency division of said output frequency divider means is actuated by said standard clock pulse after said output frequency divider means and said output clock pulse divider means are cleared by said clear pulse, and a second occurrence, at which the frequency division of said input frequency divider means is actuated by said quantized input clock pulse, is smaller than a predetermined period of said standard clock pulse.

25. In the digital phase lock loop circuit of claim 24, wherein said clear pulse generator means generates said clear pulse and said additional clear pulse with such timing that the time difference between the time of clearing of said output frequency divider means and said output clock pulse divider means, and the time of clearing of said input frequency divider means, is smaller than one-half the period of said standard clock pulse.

26. In the digital phase lock loop circuit of claim 24, wherein said clock pulse quantiziation means forms said quantized input clock pulse with such timing that the release of the clearing of said input frequency divider means lags the actuation of the frequency division of said input frequency divider means by a time lag equal to between one period and one-and-one-half periods of said standard clock pulse.

27. In the digital phase lock loop circuit of claim 24, wherein said clock pulse quantization means comprises a plurality of D-type flip-flop circuits which are connected in cascade, and wherein said D-type flip-flop circuits have a D-type input terminal and a C-type input terminal, said input clock pulse being applied to said D-input terminal of a first one of said cascaded D-type flip-flop circuits, and an inverted version of said standard clock pulse being applied to said C-input terminal of a first one of said cascaded D-type flip-flop circuits.

28. In the digital phase lock loop circuit of claim 23, said circuit comprising means for supplying a clear signal to said clear pulse generator means, and means for supplying said input clock signal to said clear pulse generator means, wherein said clear pulse generator means comprises a differentiation circuit which differentiates said clear signal applied in accordance with said input clock pulse to produce a differentiation output forming said second clear pulse, and a D-type flip-flop circuit having a D-input terminal for receiving said second clear pulse, and a C-input terminal for receiving an inverted version of said standard clock signal, and responsive thereto for generating said first clear pulse.

29. A method of phase locking an input clock signal to an output clock signal, comprising the steps of:
   (a) providing an input frequency-divider circuit and an output frequency-divider circuit;
   (b) supplying said input clock signal to said input frequency-divider circuit to produce a frequency-divided input clock signal;
   (c) processing said frequency-divided input clock signal to develop an inhibit signal;
   (d) generating a fixed-frequency standard clock signal comprising a plurality of pulses of given clock pulse period;
   (e) supplying said standard clock signal to said output frequency-divider circuit in accordance with said inhibit signal to produce a frequency-divided output signal;
   (f) generating, in accordance with said input clock signal and said output clock signal, a clear signal to clear the contents of said output frequency divider circuit;

(g) terminating said clear signal so as to release said output-frequency divider circuit for frequency-division prior to, but no more than one-half clock pulse period prior to, the occurrence of a leading edge of the next pulse of said standard clock signal; and (h) actuating said output frequency-divider circuit for frequency division by means of said leading edge of said next pulse of said standard clock signal.

30. The method of phase locking according to claim 29, comprising the additional steps of:

(i) quantizing, in accordance with said standard clock signal, the input clock signal prior to supply to said input frequency-divider circuit during step (b) to produce a quantized signal comprising an alternating plurality of leading and trailing edges;

(j) generating, in accordance with said input clock signal and said output clock signal, an additional clear signal to clear the contents of said input frequency-divider circuit;

(k) terminating said additional clear signal so as to release said input frequency-divider circuit for frequency-division prior to, but no more than one-and-one-half clock pulse periods prior to, the occurrence of the next leading edge of said quantized input clock signal; and (l) actuating said input frequency-divider circuit for frequency division by means of said next leading edge of said quantized input clock signal.

31. A method of phase locking an input clock signal to an output clock signal, comprising the steps of:

(a) providing an input frequency-divider circuit and an output frequency-divider circuit;

(b) supplying said input clock signal to said input frequency-divider circuit to produce a frequency-divided input clock signal;

(c) processing said frequency-divided input clock signal to develop an inhibit signal;

(d) generating a fixed-frequency standard clock signal comprising a plurality of pulses of given clock pulse period;

(e) supplying said standard clock signal to said output frequency-divider circuit in accordance with said inhibit signal to produce a frequency-divided output signal;

(f) quantizing, in accordance with said standard clock signal, the input clock signal prior to supply to said input frequency-divider circuit during step (b) to produce a quantized signal comprising an alternating plurality of leading and trailing edges;

(g) generating, in accordance with said input clock signal and said output clock signal, a clear signal to clear the contents of said input frequency-divider circuit;

(h) terminating said clear signal so as to release said input frequency-divider circuit for frequency-division prior to, but no more than one-and-one-half clock pulse periods prior to, the occurrence of the next leading edge of said quantized input clock signal; and (i) actuating said input frequency-divider circuit for frequency division by means of said next leading edge of said quantized input clock signal.

* * * * *